(12) United States Patent
Ockeloen-Korppi et al.

(10) Patent No.: US 11,907,805 B2
(45) Date of Patent: Feb. 20, 2024

(54) THREE-DIMENSIONAL SUPERCONDUCTING QUBIT AND A METHOD FOR MANUFACTURING THE SAME

(71) Applicant: IQM Finland Oy, Espoo (FI)

(72) Inventors: Caspar Ockeloen-Korppi, Espoo (FI); Tianyi Li, Espoo (FI); Wei Liu, Espoo (FI); Vasilii Sevriuk, Espoo (FI); Tiina Naaranoja, Espoo (FI); Mate Jenei, Espoo (FI); Jan Goetz, Espoo (FI); Kuan Yen Tan, Espoo (FI); Mikko Möttönen, Espoo (FI); Kok Wai Chan, Espoo (FI)

(73) Assignee: IQM Finland Oy, Espoo (FI)

( * ) Notice: Subject to any disclaimer, the term of this patent is extended or adjusted under 35 U.S.C. 154(b) by 116 days.

(21) Appl. No.: 17/495,085

(22) Filed: Oct. 6, 2021

(65) Prior Publication Data
US 2022/0164690 A1    May 26, 2022

(30) Foreign Application Priority Data
Nov. 23, 2020   (EP) ..................................... 20209130

(51) Int. Cl.
*G06N 10/00* (2022.01)
*H10N 60/12* (2023.01)
(Continued)

(52) U.S. Cl.
CPC ......... *G06N 10/00* (2019.01); *H10N 60/0912* (2023.02); *H10N 60/12* (2023.02); *H10N 60/805* (2023.02); *H10N 69/00* (2023.02)

(58) Field of Classification Search
CPC ..................................................... H10N 69/00
See application file for complete search history.

(56) References Cited

U.S. PATENT DOCUMENTS 10,068,184 B1   9/2018   Hertzberg et al.
11,342,492 B1 * 5/2022   Kawa ..................... H10N 69/00
(Continued)

FOREIGN PATENT DOCUMENTS

WO   2018160187   9/2018

OTHER PUBLICATIONS

International Search Report issued to PCT/FI2021/050794 dated Feb. 25, 2022, 6 pages.
(Continued)

*Primary Examiner* — Matthew L Reames
(74) *Attorney, Agent, or Firm* — Meunier Carlin & Curfman LLC

(57) ABSTRACT

A three-dimensional superconducting qubit and a method for manufacturing the same are disclosed. In an example, a three-dimensional superconducting qubit comprises a structural base comprising one or more insulating materials, and superconductive patterns on surfaces of the structural base. The superconductive patterns form at least a capacitive part and an inductive part of the three-dimensional superconducting qubit. A first surface of the surfaces of the structural base defines a first plane and a second surface of the surfaces of the structural base defines a second plane, the second plane being oriented differently than the first plane. At least one superconductive pattern of the superconductive patterns extends from the first surface to the second surface.

19 Claims, 7 Drawing Sheets

(51) Int. Cl.
*H10N 60/80* (2023.01)
*H10N 60/01* (2023.01)
*H10N 69/00* (2023.01)

(56) References Cited

U.S. PATENT DOCUMENTS

| | | |
|---|---|---|
| 2014/0246652 A1 | 9/2014 | Abraham et al. |
| 2019/0043919 A1 | 2/2019 | Hubert et al. |
| 2019/0228334 A1 | 7/2019 | Hertzberg et al. |
| 2020/0168782 A1 | 5/2020 | Adiga et al. |
| 2020/0328338 A1 | 10/2020 | Adiga et al. |
| 2022/0121978 A1* | 4/2022 | Woods ................. H10N 60/815 |

OTHER PUBLICATIONS

Extended European Search Report issued to EP Application No. 20209130.2, dated May 2, 2021, 13 pages.

\* cited by examiner

THREE-DIMENSIONAL SUPERCONDUCTING QUBIT AND A METHOD FOR MANUFACTURING THE SAME

PRIORITY CLAIM

This application claims priority to European Patent Application No. 20209130.2, filed on Nov. 23, 2020, the entire disclosure of which is incorporated by reference herein.

TECHNICAL FIELD

The present disclosure is generally related to quantum computing. In particular, the present disclosure is related to qubits and forming couplings between two or more qubits.

BACKGROUND

In quantum computing it has become common to use the term qubit to designate not only the basic unit of information but also the information storage element that is used to store one qubit of information. As an example, a superconductive memory circuit with one or more qubits (i.e. qubit-sized information storage elements) can be considered. In such an example, the qubit is an an harmonic oscillator, such as a transmon, and it may be coupled to a nearby readout resonator for facilitating the readout of the state of the qubit stored therein.

The physical implementation of a qubit must comprise not only the qubit itself but also control and readout circuitry coupled to it. At the time of writing this description, a typical superconductive qubit and its readout and control circuitry comprise two-dimensional patterns made of a superconductive material on the surface of a substrate, such as silicon or sapphire. Making a multi-qubit quantum computing circuit means replicating the necessary superconductive structures across the substrate surface. Eventually, as the number of qubits increases in size, certain limitations begin to apply. It may be difficult to make such a large quantum computing circuit fit in a cryostat, and together the qubits may dissipate so much power that it exceeds the cryogenic cooling power that is needed to cool the chip and to maintain long qubit coherence lifetime. Also the fabrication process may create limitations, when uniform qubit specifications should apply across a large area of a chip.

There is a need for structural and functional solutions that enable packing a large number of qubits into a small physical space.

SUMMARY

It is an objective to provide ways in which a qubit and its supporting circuitry can be made to occupy only a small amount of circuit area in a quantum computing circuit. Another objective is to enable packing a large number of qubits into a small space in a quantum computing circuit.

These and further advantageous objectives are achieved by utilizing three-dimensional structures, in which significant parts of the qubits and/or their supporting circuitry occupy surfaces that differ significantly from the orientation of the plane generally defined by the substrate of the quantum computing circuit.

According to a first aspect, there is provided a three-dimensional superconducting qubit. It comprises a structural base comprising one or more insulating materials, and superconductive patterns on surfaces of the structural base. The superconductive patterns form at least a capacitive part and an inductive part of the three-dimensional superconducting qubit. A first surface of the surfaces of the structural base defines a first plane and a second surface of the surfaces of the structural base defines a second plane. The second plane is oriented differently than the first plane. At least one superconductive pattern of the superconductive patterns extends from the first surface to the second surface.

According to an embodiment, the structural base comprises a planar substrate. A substrate surface of the planar substrate has the same orientation as the first surface. The second surface may then be one wall of a trench that extends into the bulk of the planar substrate. The trench is defined by walls that face each other across a void of the trench. The at least one superconductive pattern may then be at least partly located on a wall of the trench. This provides an advantage by enabling the three-dimensionality of the superconducting qubit to be built into structures inside the bulk of the substrate.

According to an embodiment, a portion of the substrate surface is covered by a superconductive ground plane. The superconductive ground plane may then continue onto one wall of the trench, different than the second surface so that the part of the at least one superconductive pattern on the second surface and the part of the superconductive ground plane that continues onto a wall of the trench face each other across the void of the trench. This provides an advantage by enabling the mutually facing patterns to be used to create couplings, such as a capacitive coupling across the trench.

According to an embodiment, the inductive part of the three-dimensional superconducting qubit is located in the plane defined by the substrate surface. This provides an advantage since the place where the inductive part is manufactured is readily accessible in the manufacturing process.

According to an embodiment, the inductive part of the three-dimensional superconducting qubit is located in the first plane, which is parallel to the plane defined by the substrate surface but located at the bottom of the trench. This provides an advantage since three-dimensional structures for other parts of the superconducting qubits are readily available at many sides of the inductive part.

According to an embodiment, the trench has a plurality of wall surfaces that define a sequence of differently oriented planes, so that the aperture at which the trench opens to the substrate surface constitutes a meandering or embattled pattern in the substrate surface. This provides an advantage since the effective surface area for making patterns on the walls of the trench is large.

According to an embodiment, the meandering or embattled pattern comprises a plurality of repetitive back and forth sections, so that the trench is limited by a plurality of interleaved protrusions, one group of which comprises portions of the at least one superconductive pattern while another group comprises portions of extensions of the superconductive ground plane. This provides an advantage since there is a relatively large space for making couplings across the trench, without the trench taking up a large footprint on the substrate area.

According to an embodiment, the trench is at least partly filled with dielectric filler material other than the substrate. This provides an advantage since the dielectric filler material can be used to affect the nature and strength of couplings between the various superconductive patterns involved.

According to an embodiment, the at least one superconductive pattern continues from the wall of the trench onto a bottom of the trench, being covered there by the dielectric filler material, and a conductive or superconductive pattern extends from the substrate surface onto top of the dielectric filler material. This provides an advantage since a capacitive coupling can be made through the dielectric material.

According to an embodiment, the structural base comprises a planar substrate. A substrate surface of the planar substrate has the same orientation as the first surface. The structural base may also comprise a piece of insulating material protruding out of the substrate surface. The second surface may be one wall of the piece of insulating material, so that the at least one superconductive pattern is at least partly located on a wall of the piece of insulating material. This provides an advantage since a large number of surfaces are quite readily accessible for making the three-dimensional parts of the superconducting qubit.

According to an embodiment, the inductive part of the three-dimensional superconducting qubit is located in a plane defined by a surface of the piece of insulating material. This provides an advantage since the location of the inductive part is relatively easily accessible during the manufacturing of the inductive part.

According to an embodiment, the piece of insulating material has a top surface that is parallel to the substrate surface but displaced from it, and the inductive part of the three-dimensional superconducting qubit is located on the top surface. This provides an advantage since the location of the inductive part is most easily accessible during the manufacturing of the inductive part.

According to an embodiment, the capacitive part of the three-dimensional superconductive qubit comprises at least two different superconductive patterns on at least two opposite parallel surfaces of the piece of insulating material. This provides an advantage since the bulk of the insulating material may have a role in internal couplings of the superconducting qubit.

According to a second aspect, there is provided a quantum computing circuit comprising at least one three-dimensional superconducting qubit of a kind described above.

According to an embodiment, the structural base comprises a planar substrate. A substrate surface of the planar substrate has the same orientation as the first surface. The quantum computing circuit may also comprise one or more superconductive tracks on the substrate surface. At least one of the superconductive tracks may have an end adjacent to the at least one three-dimensional superconductive qubit for making a non-galvanic coupling to or from the at least one three-dimensional qubit. This provides an advantage since couplings to the superconductive qubits may be made in a way that is easy to manufacture with great accuracy and repeatability in production.

According to an embodiment, the second surface is one wall of a trench that extends into the bulk of the planar substrate, so that the at least one superconductive pattern is at least partly located on a wall of the trench. The end of the at least one superconductive track may then extend onto another wall of the trench. This provides an advantage since relatively large surface areas are available for this part of the circuit, yet without reserving a large footprint on the substrate surface.

According to a third aspect, there is provided a method for manufacturing a three-dimensional superconducting qubit. The method comprises providing a structural base of one or more insulating materials, surfaces of the structural base defining at least a first plane and a second plane, the second plane being oriented differently than the first plane. The method also comprises depositing superconductive material on at least those surfaces of the structural base that define the first plane and the second plane, the superconductive material being deposited in superconductive patterns that form at least a capacitive part and an inductive part of the three-dimensional superconducting qubit. At least one superconductive pattern of the superconductive patterns is made to extend from that surface that defines the first plane to that other surface that defines the second plane.

According to an embodiment, providing the structural base comprises making a trench in an otherwise planar substrate surface, so that one wall of the trench becomes the surface that defines the second plane. This provides an advantage since three-dimensionality of the superconducting qubit can be built into structures inside the bulk of the substrate.

According to an embodiment, providing the structural base comprises depositing a piece of insulating material onto an otherwise planar substrate surface, so that one wall of the piece of insulating material becomes the surface that defines the second plane. This provides an advantage since a large number of surfaces are quite readily accessible for making the three-dimensional parts of the superconducting qubit.

According to an embodiment, depositing the superconductive material comprises using an anisotropic deposition method such as electron beam evaporation to deposit the superconductive material as a non-uniform layer on surfaces of the structural base. This provides an advantage since patterns may be produced on non-horizontal surfaces with significant accuracy.

BRIEF DESCRIPTION OF THE DRAWINGS

The accompanying drawings, which are included to provide a further understanding of the invention and constitute a part of this specification, illustrate embodiments of the invention and together with the description, help to explain the principles of the invention. In the drawings.

DETAILED DESCRIPTION

Figure 1:
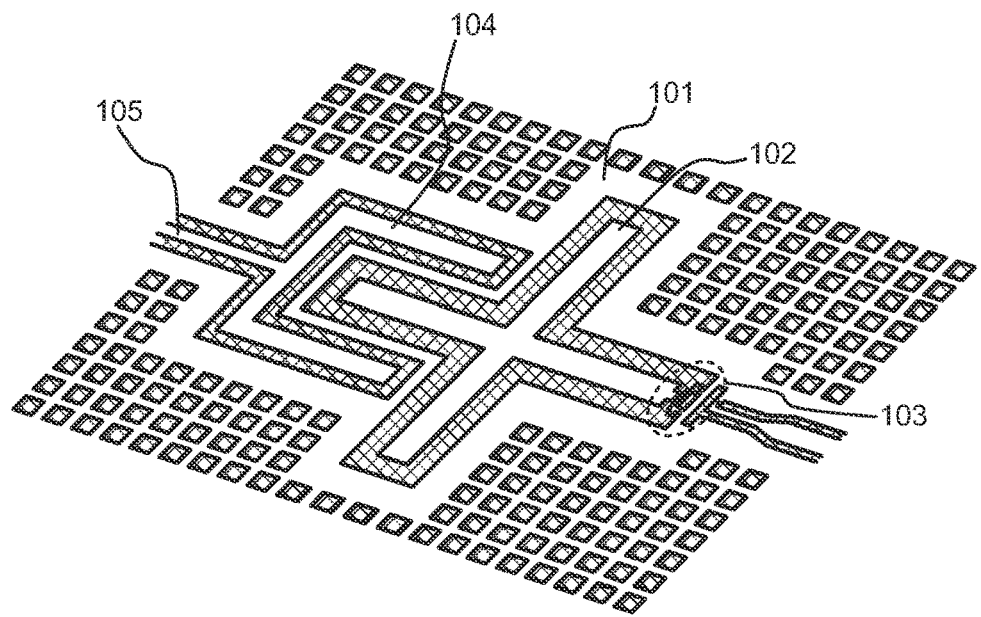
FIG. 1 illustrates a prior art superconductive qubit.

FIG. 1 illustrates an example of a superconductive qubit that consists of carefully designed patterns on a surface of a substrate. The drawing presents an axonometric view of the qubit taken at an oblique angle from above. The substrate material is dielectric, and it can be for example silicon or sapphire. Hatched areas in FIG. 1 illustrate openings where the substrate surface is visible.

Large areas of the substrate surface are covered by superconductive areas that form a ground plane 101. The matrix of small (here: square-formed) openings in the ground plane 101 serves to reduce the effect of unwanted eddy currents. The relatively large, plus-formed or X-formed pattern 102 forms, together with the adjacent edges of the ground plane 101, the capacitance component of the qubit. The inductance component of the qubit is formed by a Josephson junction or junction array, or a SQUID, between the end of one branch of the plus-formed pattern 102 and the ground plane 101 (see reference designator 103). As examples of other circuit elements that can be formed of (super)conductive patterns on the surface of the substrate, there are shown a capacitive coupling element 104 that appears as a fork-like pattern around one branch of the plus-formed pattern 102, and a transmission line 105 of the coplanar waveguide type, for the purpose of coupling the capacitive coupling element 104 to some further part of the quantum computing circuit.

Figure 2:
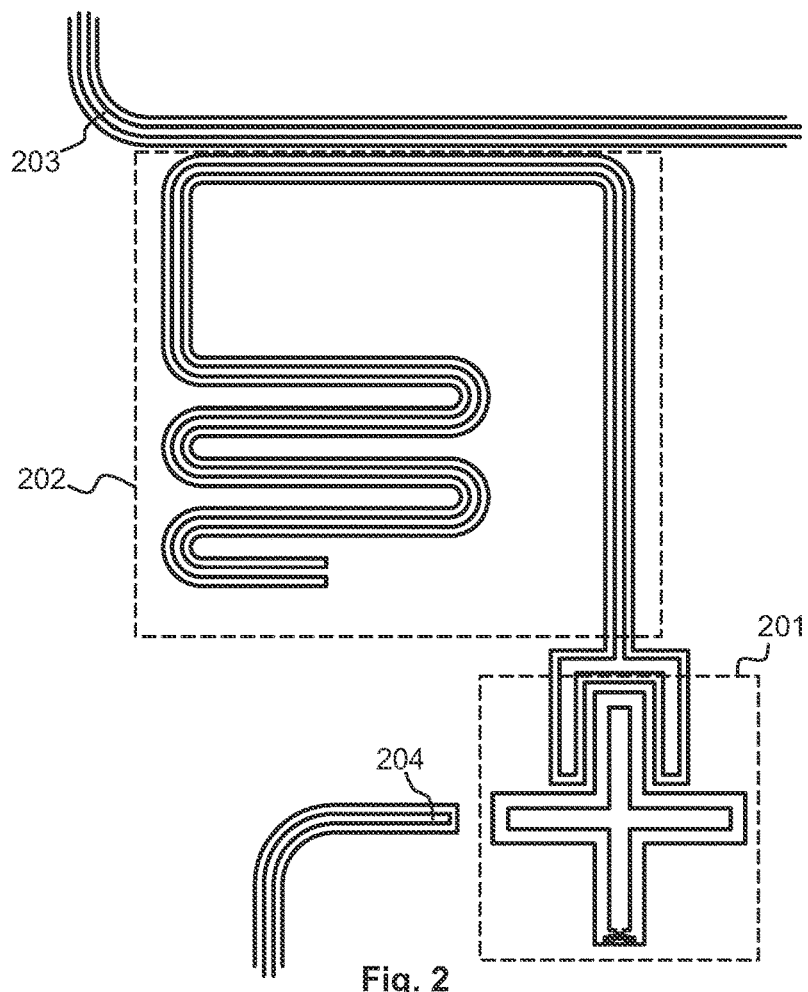
FIG. 2 illustrates a prior art qubit with an associated readout resonator and a control line.

FIG. 2 is a top view of a part of a quantum computing circuit, where a qubit 201 of the kind described above appears at the bottom part of the drawing. The capacitive coupling element is used to couple the qubit 201 to a readout resonator 202, from which there is a further coupling to a transmission line 203 at the top of the drawing. Another transmission line 204 comes close to one part of the qubit 201 and constitutes a qubit control line. The dimensions are not in scale in FIG. 2, which only serves to illustrate how the various patterns may be located in relation to each other.

If the resonance frequency of the readout resonator 202 is, say, between 3.5 and 7.5 GHz, the two-dimensional area that must be reserved for it on the substrate surface may be for example in the order of magnitude of half a mm2, like 590×1000 micrometres. If the capacitance of the capacitance component of the qubit 201 should be around 75 femtofarads, the two-dimensional area that must be reserved for the qubit 201 on the substrate surface may be for example 340×340 micrometres. The quantum computing circuit must have a multitude of qubits, and they cannot be placed arbitrarily close to each other because too short qubit-to-qubit distances would give rise to unwanted crosstalk and tangling of quantum states. Consequently, producing a multi-qubit quantum computing circuit with the techniques shown in FIGS. 1 and 2 may lead to surface area requirements so large that the circuit could be difficult to manufacture, and difficult to cool down to the cryogenic temperatures that are required for its correct operation.

Although no physical object is truly two-dimensional, it has been customary to describe circuit elements such as those shown in FIGS. 1 and 2 as two-dimensional, because their third dimension (thickness) has at most some negligible effects on their operation. However, it has now been found that many advantages may be gained by making at least some parts of a superconducting qubit—and possibly also at least some parts of at least some of the adjacent circuit elements—truly three-dimensional by structure.

Figure 3:
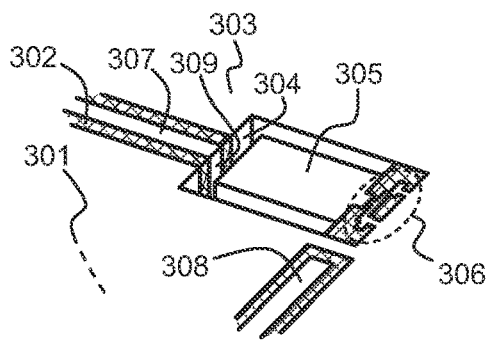
FIG. 3 illustrates an example of a three-dimensional superconductive qubit.

FIG. 3 is an axonometric view of a three-dimensional superconducting qubit according to an embodiment. It comprises a structural base, which in this embodiment is a substrate 301 made of an insulating material such as silicon or sapphire for example. Like FIG. 1 earlier, FIG. 3 only shows one part of the substrate with visible (i.e. uncovered) portions of the substrate surface shown as hatched areas, like area 302.

Also similar to the embodiment shown in FIG. 1 earlier, in the embodiment of FIG. 3 there are superconductive patterns on surfaces of the structural base. These superconductive patterns form at least a capacitive part and an inductive part of the three-dimensional superconducting qubit in a way that is described in more detail later in this text.

For the purpose of the following description the concept of a trench may be defined. A trench means a deliberately produced open cavity in the otherwise essentially planar surface of the substrate. In this text the trenches that are described may be assumed to be typically deeper than they are wide, their depth being measured in the vertical direction, i.e. the direction perpendicular to the substrate surface. A trench differs from a blind hole in that it extends across the substrate in a longitudinal direction. The trench does not need to be straight in the longitudinal direction but it may have corners, bends, arcuate portions, and the like, so that the longitudinal direction is defined as the path between two ends of the trench, or the path circulating through the trench if the opening of the trench to the substrate surface draws a closed curve. The trench may comprise branches, which means that the opening of the trench to the substrate surface does not need to consist of a single solid line.

The walls or side surfaces that reach from the substrate surface to the bottom of the trench may be essentially vertical (i.e. essentially perpendicular to the substrate surface) or they may be at an oblique angle. An individual trench may have both vertical and oblique wall portions. At any point along the longitudinal direction, the void of the trench separates two mutually facing walls. The width of the trench, i.e. the separating distance between the mutually facing walls, does not need to be constant but it may vary along the longitudinal direction of the trench. The width of the trench is typically measured in a direction perpendicular to what was called the longitudinal direction above.

As a difference to FIGS. 1 and 2, there are more than one surface of the structural base or substrate that have significance in the embodiment of FIG. 3. The planar upper surface of the substrate may be called the first surface. In the three-dimensional geometry discussed here it defines a first plane. Another surface of the structural base may be called the second surface and defines a second plane, which is oriented differently than the first plane. At least one of the superconductive patterns involved extends from the first surface to the second surface of the structural base.

More exactly, in the embodiment of FIG. 3 the structural base comprises an essentially planar substrate, the generally planar upper surface of which has the orientation of what was called the first surface above. The second surface is one wall of a trench that extends into the bulk of the planar substrate. At least one of the superconductive patterns is at least partly located on a wall of the trench.

Figure 4:
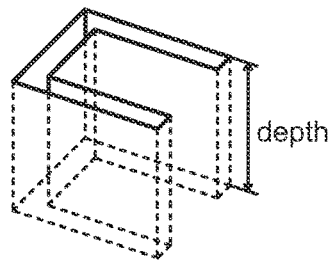
FIG. 4 illustrates a trench in a substrate that can be used to implement the qubit of FIG. 3.

FIG. 4 shows the general form of the trench in dashed lines. Seen from above the substrate surface, the trench is generally formed like a letter U with square corners in this embodiment. It extends into the bulk of the planar substrate for a certain depth. If all edges are considered straight and sharp, the trench has 8 vertical walls altogether. Any of these could be defined as the "second surface" mentioned above, because they define 7 planes in two groups of orientation, different from the orientation of the substrate top surface. Those four surfaces that define the sides of the arms of the "U" are parallel to each other, and those three surfaces that define the bottom of the "U" and the very ends of the arms of the "U" are parallel to each other. As is best seen in FIG. 4, the trench could be described by saying that it defines a portion of the substrate material that has the general form of a rectangular prism abutting on the rest of the substrate material at its bottom and one (rightmost) face.

Figure 5:
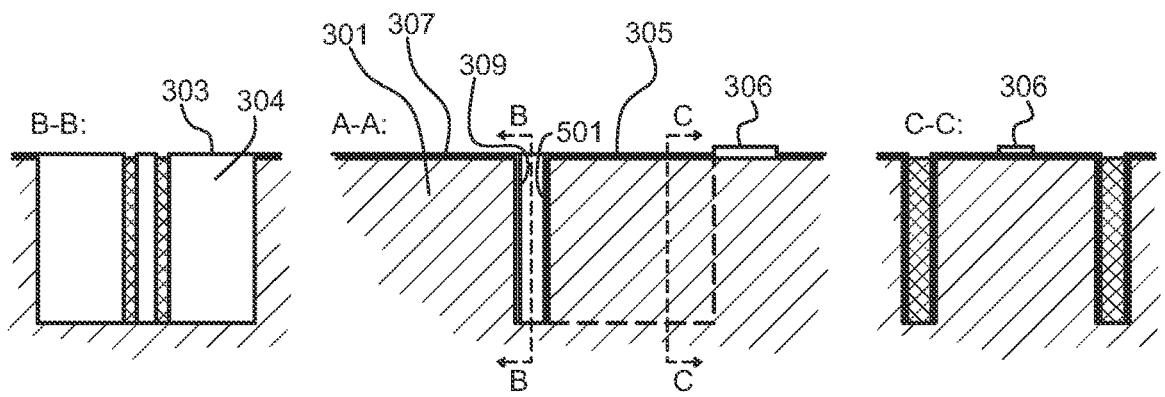
FIG. 5 illustrates four views of a three-dimensional superconductive qubit of the kind shown in FIG. 3.
Figure 5:
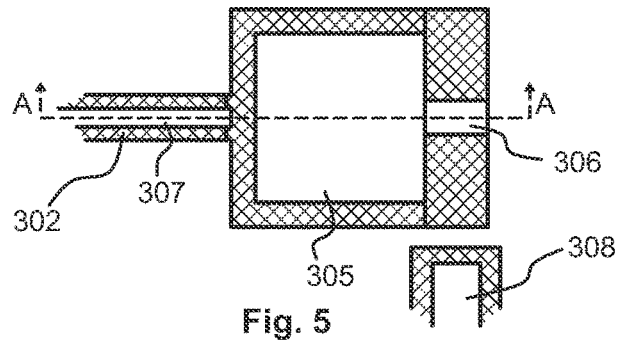

FIG. 5 shows a three-dimensional superconducting qubit of the kind shown in FIG. 3 in orthogonally oriented planar views. At the bottom of FIG. 5 is a top view, showing the three-dimensional superconducting qubit from above the substrate surface. In the middle of the top row is a cross-sectional side view taken along the line A-A. To the left and to the right are two cross-sectional end views taken along lines B-B and CC respectively.

A portion of the substrate surface is covered by a superconductive ground plane 303. Like FIG. 1, the ground plane 303 may be at least partly patterned with openings to reduce the effect of eddy currents, but these are not shown in FIGS. 3 and 5 for reasons of graphical clarity. The ground plane 303 continues onto at least one wall of the trench, as shown with the reference designator 304.

There are superconductive patterns on the open surfaces of the prism-formed substrate portion defined by the trench; see reference designators 305 and 501. These belong to the capacitive part of the three-dimensional superconducting qubit. The cross-sectional side view in FIG. 5 shows how the superconductive pattern 305 on the horizontal top surface of the prism-formed substrate portion continues into the superconductive pattern 501 on the vertical end surface of the prism-formed substrate portion. Naming the vertical end surface the "second" surface of the structural base, it may be the that the part 501 of the at least one superconductive pattern on the second surface and the part 304 of the superconductive ground plane that continues onto a wall of the trench face each other across the void of the trench.

The inductive part of the three-dimensional superconducting qubit of FIG. 3 is shown with reference designator 306. As such, it may be like the inductive parts of previously known two-dimensional superconductive qubits and comprise for example a Josephson junction, a junction array, and/or a SQUID. In FIG. 5 the inductive part 306 is shown more schematically as just a box, because its more accurate appearance does not have significance in the present discussion. In the embodiment shown in FIGS. 3 and 5 the inductive part 306 of the three-dimensional superconductive qubit is located in the "first" plane, i.e. the plane defined by the substrate surface.

Other circuit elements shown in FIGS. 3 and 5 are the transmission lines 307 and 309. They show also two examples of how couplings can be made between transmission lines and the three-dimensional superconductive qubit. In analogy with FIG. 2, the transmission line 307 may constitute a part of a readout resonator of the three-dimensional superconductive qubit. It continues into a portion 309 located on the same wall of the trench as the part 304 of the superconductive ground plane. Thus this portion also faces the part 501 of the superconductive pattern (of the capacitive part of the qubit) across the void of the trench. Thereby a capacitive coupling is established between the three-dimensional superconductive qubit and the transmission line 307.

Also in analogy with FIG. 2, the transmission line 309 may constitute a qubit control line. One of its ends comes close to the three-dimensional superconductive qubit on the substrate surface in order to make the appropriate coupling that is needed to control the qubit.

Examples of the dimensions of the trench may be obtained by calculation. Here it is assumed that the superconductive pattern 305 in the capacitive part of the three-dimensional superconductive qubit extends as a continuous layer onto all three open vertical side faces of the prism-formed substrate portion defined by the trench. Also the ground plane 303 extends onto all three vertical outer walls of the trench, so the capacitive part of the three-dimensional superconductive qubit and the ground plane face each other across the void of the trench in all three sections of the trench, and consequently form a parallel plate capacitor.

The general formula for the capacitance of a parallel plate capacitor is $$C=\varepsilon_0\varepsilon_r A/d,$$

where C denotes capacitance, $\varepsilon_0$ is the vacuum permittivity, $\varepsilon_r$ is the relative permittivity (=1 here, because the medium is vacuum when the qubit is operational), A is the area of the parallel plates and d is their perpendicular distance. If each side face of the prism-formed substrate portion defined by the trench is 300×300 micrometres, a capacitance of 75 femtofarads is obtained at a trench width d=32 micrometres. Standard substrates for quantum computing circuits have a thickness of 675 micrometres, so a 300 micrometres deep trench can be formed therein without problems. The qubit footprint (i.e. the area of substrate surface needed for the qubit) can be made smaller than 300×300 micrometres by making the trench deeper and/or narrower.

Figure 6:
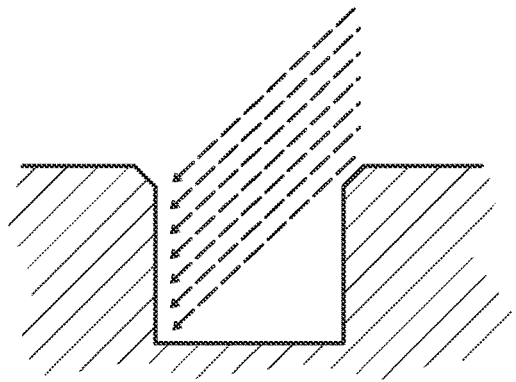
FIG. 6 illustrates the principle of directed deposition of superconductive material.

The trench can be fabricated using a suitable method, such as deep reactive ion etching for example. The superconductive patterns on the trench walls can be produced with a suitable thin film deposition method, such as atomic layer deposition (ALD) for example. In its basic form ALD is conformal, which means that also the bottom of the trench and those parts of the side walls that should remain bare will be coated with the deposited superconductive material. A suitable anisotropic etching method can be used to remove the deposited superconductive material from where it should not remain. An alternative to ALD is to use an anisotropic thin film deposition method like thermal or electron beam evaporation, which is schematically illustrated in FIG. 6. By directing the flux of the material to be deposited at an oblique angle across the trench, as shown with the arrows in FIG. 6, one may ensure that only the exposed wall of the trench will become patterned.

Figure 7:
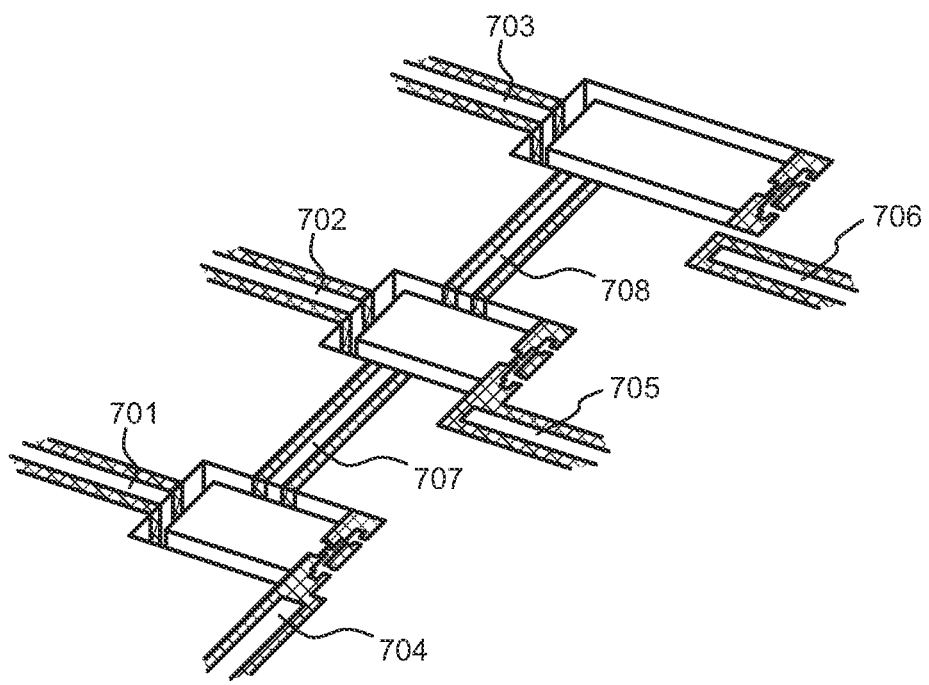
FIG. 7 illustrates couplings between three-dimensional superconductive qubits of the kind shown in FIG. 3.

FIG. 7 illustrates a quantum computing circuit that comprises a plurality of three-dimensional superconductive qubits. As in the embodiments above, the structural base of the quantum computing circuit comprises a planar substrate. The substrate surface has the orientation of the "first" surface mentioned above. The quantum computing circuit comprises one or more superconductive tracks on the substrate surface. At least one of the superconductive tracks has an end adjacent to at least one of the three-dimensional superconductive qubits for making a non-galvanic coupling to or from that qubit.

In the embodiment of FIG. 7 the superconductive tracks 701, 702, and 703 are similar to the transmission line 307 shown in FIGS. 3 and 5, and they can be used as parts of the respective readout resonators of the three qubits shown in FIG. 7. The superconductive tracks 704, 705, and 706 are similar to the transmission line 308 shown in FIGS. 3 and 5, and they can be used as control lines to the respective qubits shown in FIG. 7. The superconductive tracks 707 and 708 may be used to make qubit-to-qubit couplings. They are similar to the superconductive tracks 701, 702, and 703 in that an end of the respective superconductive track extends onto a wall of a trench, across the void of which it faces a superconductive pattern that in turn constitutes a part of the capacitive component of a three-dimensional superconductive qubit.

Figure 8:
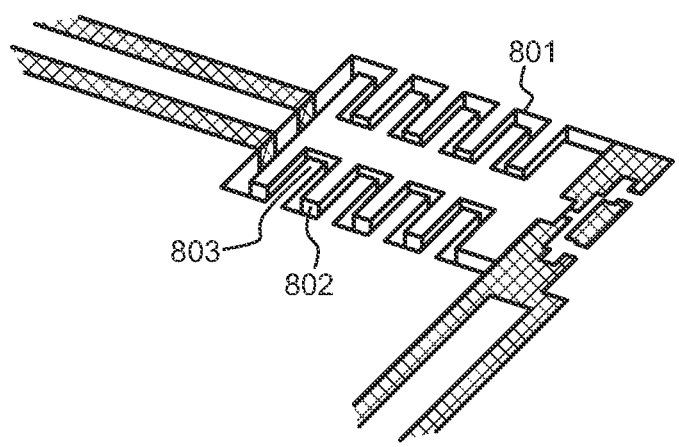
FIG. 8 illustrates an example of how a capacitive part of a three-dimensional qubit can be implemented in a small space.

FIG. 8 illustrates a three-dimensional superconductive qubit according to an embodiment. Many features are similar to those shown in FIGS. 3 and 5, but the trench is formed differently. Instead of the relatively simple form shown in FIGS. 3 and 5, in FIG. 8 the trench has a plurality of wall surfaces that define a sequence of differently oriented planes. In other words, the aperture at which the trench opens to the substrate surface constitutes a meandering or embattled pattern 801 in the substrate surface. This way it is possible to increase the surface area of the parallel plate capacitor formed by the mutually facing superconductive patterns on the vertical walls of the trench.

In FIG. 8 the meandering or embattled pattern of the aperture, at which the trench opens to the substrate surface, has a particular, regular form. It comprises a plurality of repetitive back and forth sections, so that the trench is limited by a plurality of interleaved protrusions. One group of these protrusions, i.e. those on the inside of the trench (see protrusion 802 for example), comprise portions of the superconductive pattern in the capacitive part of the qubit. Another group, i.e. those on the outside of the trench (see protrusion 803 for example), comprise portions of extensions of the superconductive ground plane on the surrounding substrate surface.

In a three-dimensional superconducting qubit like that in FIG. 8, the surface area available for the parallel plate capacitor is approximately equal to the overall end-to-end length measured along the meandering or embattled pattern times the depth of the trench.

Figure 9:
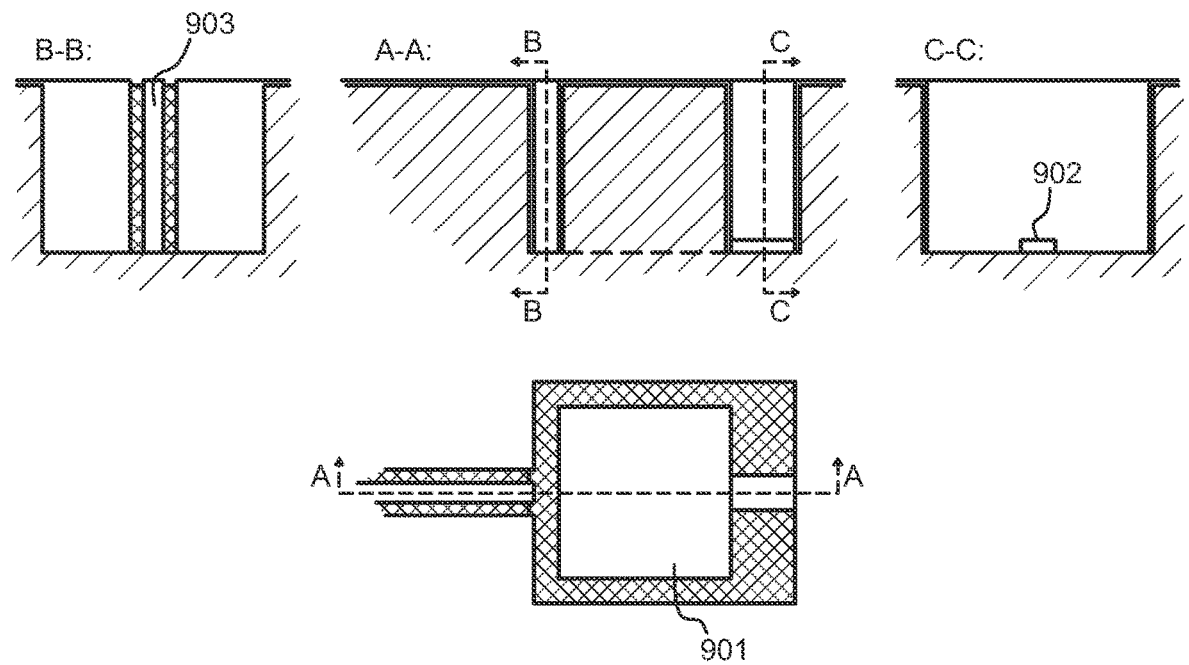
FIG. 9 illustrates four views of a three-dimensional superconductive qubit, according to an embodiment.

In the embodiments discussed so far, the inductive part of the three-dimensional superconducting qubit has been essentially in the plane defined by the substrate surface. This is not a requirement, as other ways of placing the inductive part are possible. FIG. 9 illustrates a three-dimensional superconducting qubit in which the trench forms a closed curve around a block 901 of the substrate material. What is called here a "first" plane is defined by the bottom of the trench. This plane is parallel to the plane defined by the substrate surface but located at the bottom of the trench, i.e. displaced by the depth of the trench from the plane defined by the substrate surface. The inductive part of the three-dimensional superconductive qubit is located in the first plane, as schematically shown by block 902.

In the embodiment of FIG. 9, the vertical surfaces of the block 901 of substrate material are all covered by the superconductive material that implements the capacitive part of the qubit. The vertical outer surfaces of the trench, i.e. those that face the vertical surfaces of the block 901 of substrate material across the void of the trench, are all covered by the superconductive material that extends thereto from the ground plane on the substrate surface, except for possible coupling elements such as the downwards-extending end of the transmission line 903 in FIG. 9.

Figure 10:
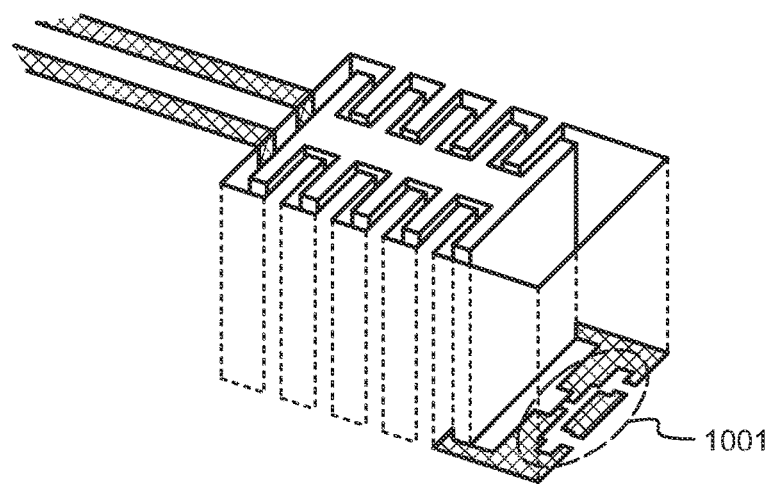
FIG. 10 illustrates a three-dimensional superconductive qubit, according to an embodiment.

Allowing the trench to form a closed curve around the block of substrate material, like in FIG. 9, provides an advantage by creating more surface area for implementing the capacitive part than in those embodiments where the trench is e.g. U-formed like in FIGS. 3, 5, and 7. If still more surface area is needed, and/or if the desired surface area is to be packed into a smaller footprint on the substrate surface, the principles shown in FIG. 8 and FIG. 9 can be combined to give the three-dimensional superconducting qubit of FIG. 10. In this combined embodiment, the inductive part 1001 of the three-dimensional superconducting qubit is located in the first plane, which is parallel to the plane defined by the substrate surface but located at the bottom of the trench, like in FIG. 9. The trench has a plurality of wall surfaces that define a sequence of differently oriented planes, so that the aperture at which the trench opens to the substrate surface constitutes a meandering or embattled pattern in the substrate surface, like in FIG. 8.

Figure 11:
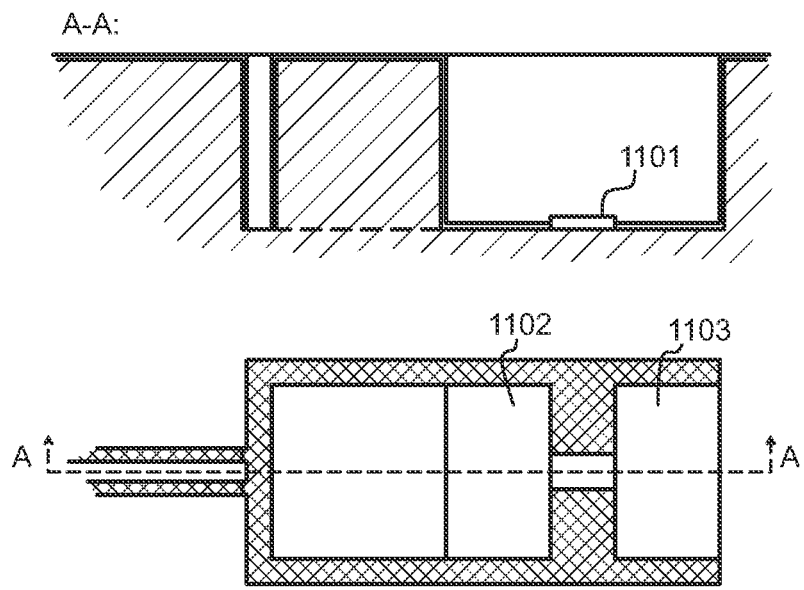
FIG. 11 illustrates two views of a three-dimensional superconductive qubit, according to an embodiment.

FIG. 11 illustrates a three-dimensional superconducting qubit that resembles that of FIG. 9. As a difference, that part of the trench where the inductive part 1101 of the qubit is located is made larger. If the inductive part 1101 of the qubit does not take up all the area available at the bottom of this larger part of the trench, it can be utilized for example for conductive patterns, such as those shown with reference designators 1102 and 1103 in FIG. 11. Providing a wider portion of the trench, on the bottom of which the inductive part 1101 is formed, provides an advantage since it may be easier to perform the steps of the photolithographic or other manufacturing method of the inductive part 1101 than if the trench portion was only of the size that just allows the inductive part to fit on its bottom.

Figure 12:
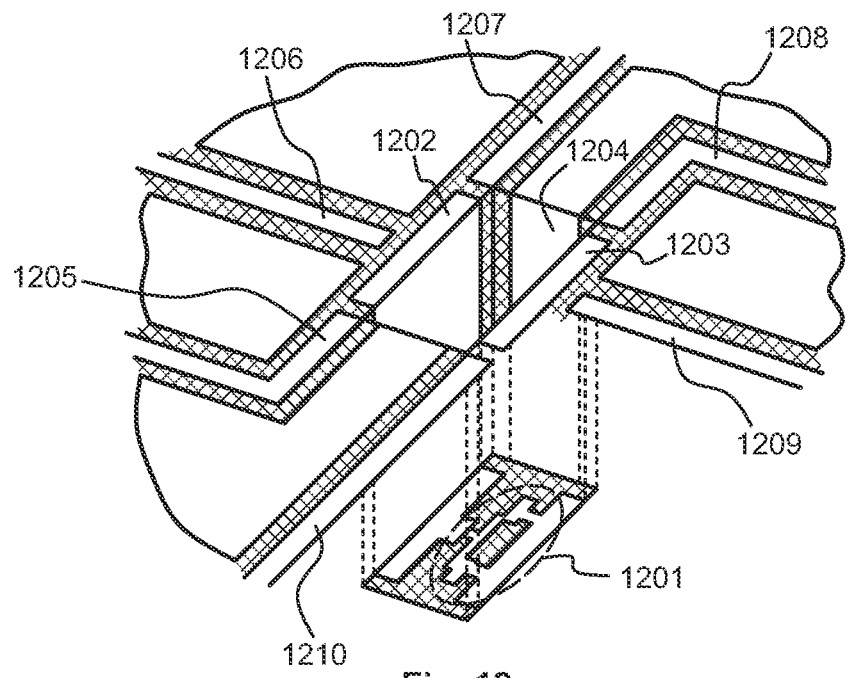
FIG. 12 illustrates a three-dimensional superconductive qubit, according to an embodiment.

FIG. 12 illustrates an example of how a plurality of non-galvanic couplings can be made to or from a three-dimensional superconductive qubit in which the inductive part 1201 is located at a bottom of a trench. FIG. 12 shows the three-dimensional superconductive qubit with partial transparency so that the patterns and surface areas of the substrate are not shown in the sector facing the viewer. For this reason, one can see the inductive part 1201 at the bottom of the trench in FIG. 12. The capacitive part of the qubit includes superconductive material on two vertical surfaces of the trench or opening, extending into flaps 1202 and 1203 on the substrate surface. Some parts of a ground plane on the substrate surface may continue on other vertical walls of the trench, as shown with reference designator 1204, for example. A multitude of coupling elements 1205, 1206, 1207, 1208, 1209, and 1210 may come close to the edges of that superconductive material that is included in the capacitive part of the qubit.

Figure 13:
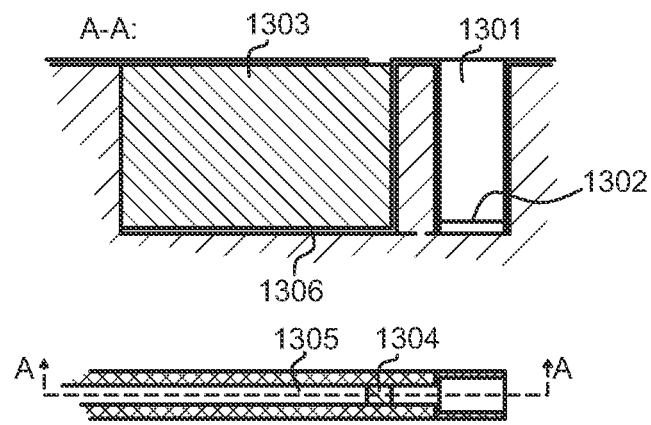
FIG. 13 illustrates two views of a three-dimensional superconductive qubit, according to an embodiment.

FIG. 13 illustrates a three-dimensional superconducting qubit, according to an embodiment. There are two trenches that extend from the substrate surface into the bulk of the substrate. One of these is the trench 1301 on the right, on the bottom of which the inductive part 1302 of the qubit is located. The other trench does not appear as a void in FIG. 13 because it is at least partly filled with a piece of dielectric filler material 1303 other than the substrate, such as aluminium oxide, for example. A small portion of the top surface of the piece of dielectric material 1303 is visible in the top view, as shown with reference designator 1304.

One extremity 1305 of a conductive or superconductive pattern, a main part of which is located on the substrate surface, extends from the substrate surface onto the top surface of the piece of dielectric filler material 1303. Opposite to it, at the bottom of the trench that is filled with the piece of dielectric material 1303, is a superconductive pattern 1306 that may constitute a coupler and/or belong to the capacitive part of the superconductive qubit. This superconductive pattern 1306 continues from one vertical wall onto a bottom of the trench, being covered there by the dielectric filler material. At its other end it continues over the ridge that separates the two trenches, down to the bottom of the other trench 1301 where it connects to the inductive part 1302 of the qubit.

The structure of FIG. 13 provides an advantage since the properties of the piece of dielectric material 1303 can be utilized to tailor the characteristics of the coupler and/or capacitive part of the qubit, of which the pattern 1306 is a part. In an alternative embodiment, the inductive part 1302 does not necessarily need to be at a bottom of another trench 1301, but it may be on the substrate surface. However, the use of another trench 1301 provides an advantage since those parts of the pattern 1306 that face a vertical extension of a ground plane across the void of such another trench can be used to increase the capacitance of the capacitive part of the qubit.

Structures like that in FIG. 13 can be produced, for example, by first masking the area with a suitable mask material, then using a reactive ion etching process to produce the trenches, adding another masking layer if needed, using an electron beam evaporator to deposit the aluminium oxide or other dielectric material, and finally depositing normal metal(s) and/or superconductive material(s) at appropriate locations, including on top of the previously deposited aluminium oxide part.

Figure 14:
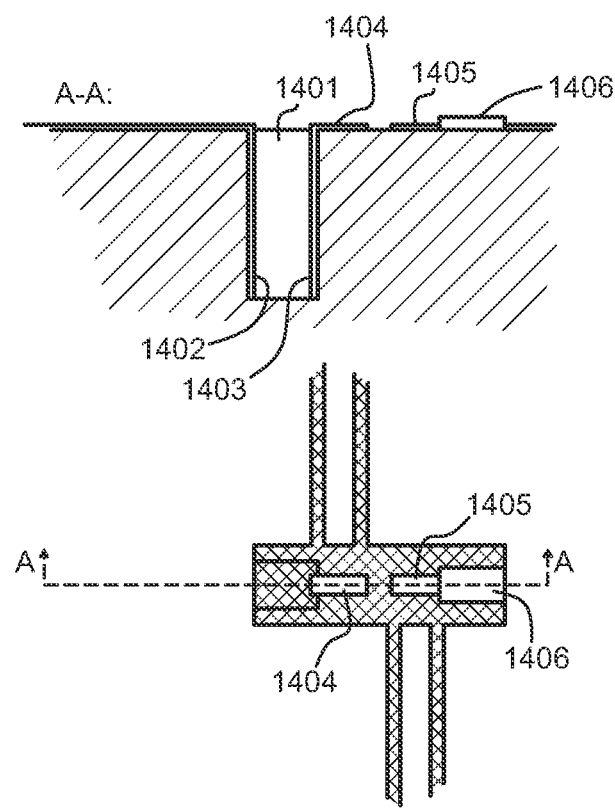
FIG. 14 illustrates two views of a three-dimensional superconductive qubit, according to an embodiment.

FIG. 14 illustrates a three-dimensional superconducting qubit in which the vertical walls of a trench 1401 are used for the purposes of a readout resonator. At least one vertical wall of the trench 1401 comprises an extension 1402 of a ground plane, the main part of which is located on the substrate surface. Another vertical wall of the trench 1401 comprises an extension 1403 of a superconductive pattern 1404, from which there is a further, non-galvanic coupling to a further superconductive pattern 1405 that belongs to the capacitive part of the qubit. This further superconductive pattern 1405 is connected to the inductive part 1406 of the qubit, which in this embodiment is located on the plane defined by the substrate surface but which could be located also in, for example, another trench.

The embodiment of FIG. 14 provides an advantage since the readout resonator of the three-dimensional superconducting qubit can be realized with a smaller footprint on the substrate surface than in prior art. This is because the readout resonator utilized at least partly the "second plane", i.e. a surface that is not parallel to the substrate surface but constitutes, for example, a wall of a trench.

Figure 15:
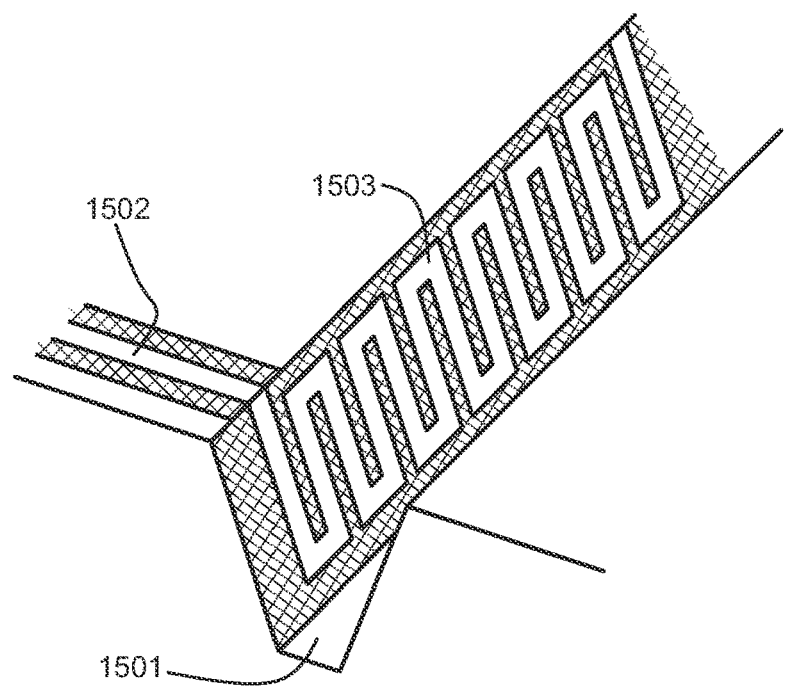
FIG. 15 illustrates the use of an anisotropically etched trench to implement a resonator.

FIG. 15 extends the embodiment of FIG. 14 into resonator structures that comprise more elaborate patterns on the walls of trenches. FIG. 15 is an axonometric view of a substrate cut in half with a vertical plane, so that the form of a trench 1501 is clearly visible. Here, the side walls of the trench 1501 are not vertical but at an oblique angle against the substrate surface. The end of a transmission line 1502 on the substrate surface extends onto a wall of the trench 1501, forming a meandering or embattled pattern 1503. Methods and devices for accurately forming patterns, such as the meandering or embattled pattern 1503 of FIG. 15, for example, onto trench walls are available at least from the Fraunhofer-Institut für Mikrotechnik and Mikrosysteme IMM, Carl-Zeiss-Str. 18-20, 55129 Mainz, Germany.

Figure 16:
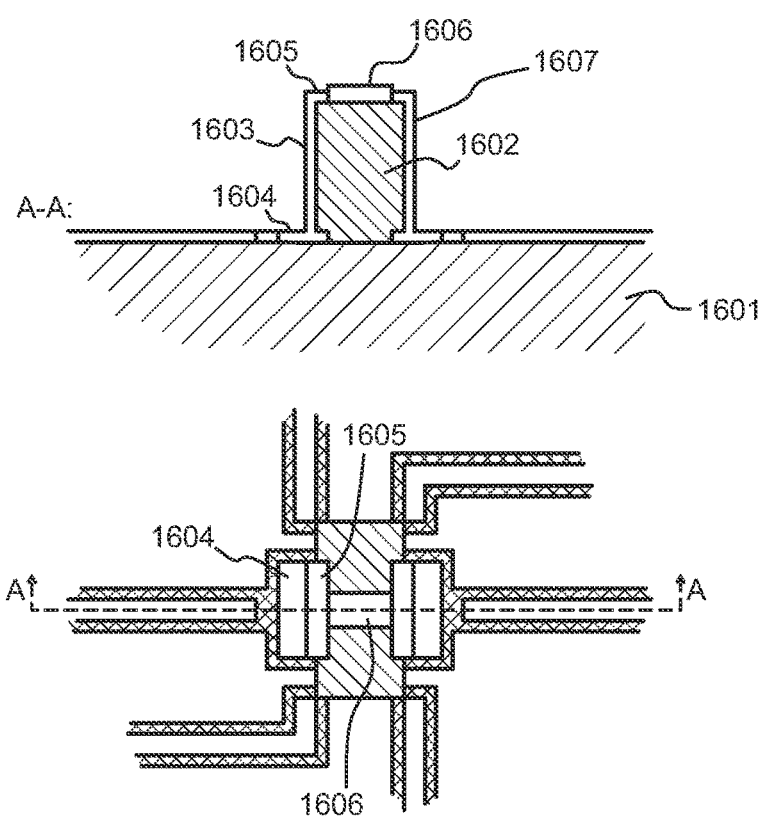
FIG. 16 illustrates two views of a three-dimensional superconductive qubit, according to an embodiment.

FIG. 16 shows a three-dimensional superconducting qubit, according to an embodiment in which the three-dimensionality appears mainly above the substrate surface and not below it, as in the other embodiments described above. In FIG. 16, the structural base comprises a planar substrate 1601, which may be silicon or sapphire for example. Again, the substrate surface of the planar substrate 1601 may define the orientation of what is here called the first plane. In addition, the structural base comprises a piece of insulating material 1602 protruding out of the substrate surface. The piece of insulating material 1602 may be a block of aluminium oxide, for example.

What is here called the second surface is one wall of the piece of insulating material 1602. The cross-sectional side view in the upper part of FIG. 16 shows how there is a superconductive pattern 1603 at least partly located on a side wall of the piece of insulating material 1602. At one (lower) extremity thereof, the superconductive pattern 1603 extends onto the substrate surface, where it forms a flap-like patch (see reference designator 1604). At another (upper) extremity thereof, the superconductive pattern 1603 extends on to the top surface of the piece of insulating material 1602, where it forms another flap-like patch (see reference designator 1605).

In the embodiment of FIG. 16 the inductive part 1606 of the three-dimensional superconductive qubit is located in a plane defined by a surface (here: top surface) of the piece of insulating material 1602. The top surface is parallel to the substrate surface but displaced from it by the height of the piece of insulating material 1602.

Additionally, in the embodiment of FIG. 16, the capacitive part of the three-dimensional superconductive qubit comprises at least two different superconductive patterns on at least two opposite parallel surfaces of the piece of insulating material 1602. These are the pattern 1603 (mentioned above) and another, similar pattern 1607 located mainly on the opposite vertical side surface of the piece of insulating material 1602.

The top view shown in the lower part of FIG. 16 shows an example of how coupling elements on the substrate surface may come close to the root of the piece of dielectric material 1602, where they form non-galvanic couplings to and from the three-dimensional superconducting qubit of FIG. 16.

A quantum computing circuit according to an embodiment may comprise one or more three-dimensional superconducting qubits of any of the kinds described above. Of the various embodiments, qubits of the same kind may be used throughout the quantum computing circuit or there may be representatives of various kinds of three-dimensional superconducting qubits on the same quantum computing circuit.

In many cases, the structural base of the three-dimensional superconducting qubit(s) is simultaneously a structural base of the whole quantum computing circuit or at least of a significant part thereof. The structural base may comprise a planar substrate, the substrate surface of which having the orientation of what is here called the first surface. The quantum computing circuit may then comprise one or more superconductive tracks on the substrate surface. At least one of such superconductive tracks may have an end that is adjacent to a three-dimensional superconducting qubit of the quantum computing circuit, for making a non-galvanic coupling to and/or from the qubit. Examples of such ends of superconductive tracks are seen in many of the drawings above that illustrate three-dimensional superconducting qubits in top or axonometric views.

In some embodiments, what has been called the second surface above is one wall of a trench that extends into the bulk of the planar substrate. In such a case, the at least one superconductive pattern mentioned above may be at least partly located on a wall of such a trench. The end of the at least one superconductive track, which is used to make a non-galvanic coupling to and/or from the qubit, may extend onto another wall of such a trench in the quantum computing circuit.

Some possible steps of methods for manufacturing a three-dimensional superconducting qubit have been mentioned above already. In general, such a method comprises providing a structural base of one or more insulating materials, such as silicon or sapphire for example. Surfaces of such a structural base define at least a first plane and a second plane, of which the second plane is oriented differently than the first plane. In order to make the structural base comprise such differently oriented surfaces, the method may comprise for example, making a trench in an otherwise planar substrate surface, so that one wall of the trench becomes the surface that defines the second plane. Additionally or alternatively, the method may comprise depositing a piece of insulating material onto an otherwise planar substrate surface, so that one wall of the piece of insulating material becomes the surface that defines the second plane.

In general, the method comprises depositing superconductive material on at least those surfaces of the structural base that define the first plane and the second plane. The superconductive material is deposited in superconductive patterns that form at least a capacitive part and an inductive part of the three-dimensional superconducting qubit. At least one superconductive pattern is made to extend from that surface that defines the first plane to that other surface that defines the second plane.

One possibility of depositing superconductive material may comprise using an anisotropic deposition method such as electron beam evaporation to deposit the superconductive material as a non-uniform layer on surfaces of the structural base.

Additions and modifications to the example embodiments described above are possible. Features that have been described in isolation may be combined in many ways, as is evident for the person skilled in the art. As an example, the technology of accurately patterning walls of trenches in the substrate, which was described above with reference to FIG. 15, may well be used to augment the relatively simple design of the three-dimensional superconductive qubits described earlier with reference to FIGS. 3 and 5.

The invention claimed is:

1. A three-dimensional superconducting qubit comprising:
   a structural base comprising one or more insulating materials; and
   at least two superconductive patterns on at least three surfaces of the structural base, including a first surface, a second surface, and a third surface, the at least two superconductive patterns forming at least a capacitive part and an inductive part of the three-dimensional superconducting qubit,
   wherein the first surface of the structural base defines a first plane having a similar orientation as that of a top surface of the structural base,
   wherein the second surface of the structural base defines a second plane that is oriented differently than the first plane,
   wherein the third surface of the structural base defines a third plane that is oriented differently than the first plane and the second plane, and
   wherein a first pattern of the at least two superconductive patterns extends from the first surface to the second surface and a second pattern of the at least two superconductive patterns extends from the first surface to the third surface.

2. The three-dimensional superconducting qubit of claim 1, wherein:
   the structural base comprises a planar substrate, a substrate surface of the planar substrate having the same orientation as the first surface;
   the second surface is one wall of a trench that extends into a bulk of the planar substrate; and
   the trench is defined by walls that face each other across a void of the trench so that the first pattern is at least partly located on a wall of the trench.

3. The three-dimensional superconducting qubit of claim 2, wherein:
   a portion of the substrate surface is covered by a superconductive ground plane; and
   the superconductive ground plane continues onto one wall of the trench, different than the second surface, so that the part of the first pattern on the second surface and the part of the superconductive ground plane that continues onto a wall of the trench face each other across the void of the trench.

4. The three-dimensional superconducting qubit of claim 3, wherein the inductive part of the three-dimensional superconducting qubit is located in the plane defined by the substrate surface.

5. The three-dimensional superconducting qubit of claim 3, wherein the inductive part of the three-dimensional superconducting qubit is located in the first plane, wherein the first plane is parallel to the substrate surface but located at a bottom of the trench.

6. The three-dimensional superconducting qubit of claim 3, wherein the trench has a plurality of wall surfaces that define a sequence of differently oriented planes, so that an aperture at which the trench opens to the substrate surface constitutes a meandering or embattled pattern in the substrate surface.

7. The three-dimensional superconducting qubit of claim 6, wherein the meandering or embattled pattern comprises a plurality of repetitive back and forth sections, so that the trench is limited by a plurality of interleaved protrusions, one group of which comprises portions of the at least two superconductive patterns while another group comprises portions of extensions of the superconductive ground plane.

8. The three-dimensional superconducting qubit of claim 2, wherein the trench is at least partly filled with dielectric filler material other than the substrate.

9. The three-dimensional superconducting qubit of claim 8, wherein:
   the first pattern continues from the wall of the trench onto a bottom of the trench, being covered there by the dielectric filler material; and
   a conductive or superconductive pattern extends from the substrate surface onto a top of the dielectric filler material.

10. The three-dimensional superconducting qubit of claim 1, wherein:
    the structural base comprises a planar substrate, a substrate surface of the planar substrate having the same orientation as the first surface;
    the structural base comprises a piece of insulating material protruding out of the substrate surface; and
    the second surface is one wall of the piece of insulating material so that the first pattern is at least partly located on a wall of the piece of insulating material.

11. The three-dimensional superconducting qubit of claim 10, wherein the inductive part of the three-dimensional superconducting qubit is located in a plane defined by a surface of the piece of insulating material.

12. The three-dimensional superconducting qubit of claim 11, wherein:
the piece of insulating material has a top surface that is parallel to the substrate surface but displaced from it; and
the inductive part of the three-dimensional superconducting qubit is located on the top surface.

13. A quantum computing circuit comprising at least one three-dimensional superconducting qubit, wherein the at least one three-dimensional superconducting qubit comprises:
a structural base comprising one or more insulating materials; and
at least two superconductive patterns on at least three surfaces of the structural base, including a first surface, a second surface, and a third surface, the at least two superconductive patterns forming at least a capacitive part and an inductive part of the at least one three-dimensional superconducting qubit,
wherein the first surface of the structural base defines a first plane having a similar orientation as that of a top surface of the structural base,
wherein the second surface of the structural base defines a second plane that is oriented differently than the first plane,
wherein the third surface of the structural base defines a third plane that is oriented differently than the first plane and the second plane, and
wherein a first pattern of the at least two superconductive patterns extends from the first surface to the second surface and a second pattern of the at least two superconductive patterns extends the from the first surface to the third surface.

14. The quantum computing circuit of claim 13, wherein:
the structural base comprises a planar substrate, a substrate surface of the planar substrate having the same orientation as the first surface;
the quantum computing circuit comprises one or more superconductive tracks on the substrate surface; and
at least one of the superconductive tracks has an end adjacent to the at least one three-dimensional superconducting qubit for making a non-galvanic coupling to or from the at least one three-dimensional superconducting qubit.

15. The quantum computing circuit of claim 14, wherein:
the second surface is one wall of a trench that extends into a bulk of the planar substrate, so that the first pattern is at least partly located on a wall of the trench; and
the end of the at least one superconductive track extends onto another wall of the trench.

16. A method for manufacturing a three-dimensional superconducting qubit, the method comprising:
providing a structural base of one or more insulating materials, the structural base comprising at least three surfaces including a first surface, a second surface, and a third surface, wherein the first surface of the structural base defines a first plane having a similar orientation as that of a top surface of the structural base, wherein the second surface of the structural base defines a second plane that is oriented differently than the first plane, and wherein the third surface of the structural base defines a third plane that is oriented differently than the first plane and the second plane; and
depositing superconductive material on the at least three surfaces of the structural base that define the first plane and the second plane, the superconductive material being deposited in at least two superconductive patterns that form at least a capacitive part and an inductive part of the three-dimensional superconducting qubit,
wherein a first pattern of the at least two superconductive patterns is made to extend from the first surface that defines the first plane to the second surface that defines the second plane and a second pattern of the at least two superconductive patterns extends the from the first surface that defines the first plane to the third surface that defines the third plane.

17. The method of claim 16, wherein providing the structural base comprises making a trench in an otherwise planar substrate surface, so that one wall of the trench becomes the surface that defines the second plane.

18. The method of claim 16, wherein providing the structural base comprises depositing a piece of insulating material onto an otherwise planar substrate surface, so that one wall of the piece of insulating material becomes the surface that defines the second plane.

19. The method of claim 16, wherein depositing the superconductive material comprises using an anisotropic deposition method such as electron beam evaporation to deposit the superconductive material as a non-uniform layer on surfaces of the structural base.

* * * * *